United States Patent [19]

Schornack et al.

[11] 3,997,852
[45] Dec. 14, 1976

[54] RF AMPLIFIER

[75] Inventors: Louis Wilfred Schornack, Arlington Heights; William Frank Graf, Jr., Riverside, both of Ill.

[73] Assignee: Motorola, Inc., Schaumburg, Ill.

[22] Filed: June 6, 1975

[21] Appl. No.: 584,559

[52] U.S. Cl. .................. 330/35; 330/29; 330/165; 330/188; 330/195

[51] Int. Cl.[2] .......................... H03F 3/16

[58] Field of Search ............ 330/20, 35, 165, 188, 330/195

[56] References Cited
UNITED STATES PATENTS

| | | | |
|---|---|---|---|
| 3,371,290 | 2/1968 | Kibler | 330/35 X |
| 3,525,050 | 8/1970 | Wolf et al. | 330/35 X |

*Primary Examiner*—James B. Mullins
*Assistant Examiner*—Lawrence J. Dahl
*Attorney, Agent, or Firm*—James W. Gillman; Victor Myer

[57] ABSTRACT

An R. F. wide band amplifier is disclosed. It comprises a high impedance step up transformer at the input end, a wide band high impedance J-Fet attenuator connected to the step up transformer, a dual gate MosFet amplifier connected to the attenuator and a high impedance wide band step down transformer connected to the output of the MosFet. The output of the amplifier is taken from the stepped down side of the transformer.

8 Claims, 4 Drawing Figures

RF AMPLIFIER

RELATED APPLICATIONS

This application is related to the copending application of the same inventors, Ser. No. 576,828, filed May 12, 1975, entitled: High Frequency Wide Band Transformer and assigned to the same assignee as the present invention.

BACKGROUND OF THE INVENTION

This invention relates to an RF amplifier intended for operation over a wide band, for example, 1.6–18Mhz and it is an object of the invention to provide an improved RF amplifier of this nature.

In the design of quality communication receivers, for the high frequency bands, the prior art has usually relied on large cumbersome multi-wafered band switches to accomplish the necessary switching of tuned circuits for each segment of the receiver's operating range. Such receivers were, accordingly, large, cumbersome and expensive. Even so, the receivers had to deal with the ever present problems of intermodulation, cross modulation and blocking, particularly in the instances where a relatively small desired signal was in the particular band within which a relatively large undesired signal existed.

Simplifying communication's receivers of the nature indicated required that the initial or input RF amplifier stages have a wide band response, such as from 1.6 to 18Mhz, and have that response essentially linear throughout that range. Transformers receiving all frequencies over the indicated band have to provide an output impedance of relatively high value and have a linear response over this same frequency range. The transformers also need to be capable of handling large signal levels such, for example, as an RF input of one volt RMS with no degradation of performance.

Satisfactory operation of an RF communications receiver in an environment of high level RF signals requires that protection of some nature be present near the receiver input to protect against the generation of intermodulation distortion products, cross modulation distortion products and de-sensitization or blocking in the first active stage or stages of the receiver, such as the first amplifier. Besides the use of band pass, low pass, or high pass filters at the immediate input to the receiver, a variable RF attenuator located between such filters and the first amplifier would limit the remaining off channel high level signals to tolerable levels. According to the invention, an attenuator of the shunt-series-shunt configuration utilizing J-Fet semiconductor devices can provide a range of attenuation from 45db to 1db depending upon the value of the input signal. The amplifier proper for the required linearity may be of the MosFet type which operates most satisfactorily at relatively high impedance levels. Such a high impedance level is achieved by the J-Fet attenuator and by the transformer which supplies the signals to the input of the attenuator.

SUMMARY OF THE INVENTION

In carrying out the invention according to one form there is provided a wide band RF amplifier comprising a first wide band transformer having a relatively high output impedance transformation at the amplifier input, a wide band field effect transistor attenuator having an input connected to the high output impedance and having an output, a field effect transistor amplifier having an input connected to the attenuator output, and a second wide band transformer having a relatively high impedance transformation connected with its high impedance side to the output of the field effect transistor amplifier.

In carrying out the invention according to another form the field effect transistor attenuator comprises a π network of one series and two parallel J-Fet transistors, the wide band transformers comprise a series of flat windings each of which is spirally wound on itself and the field effect transistor amplifier comprises a dual gate MosFet amplifier, one gate of which comprises a bias gate and the other of which comprises a signal input gate.

It is a further object of the invention to provide an improved RF amplifier which will obviate the disadvantages of the prior art.

It is a further object of the invention to provide an improved RF amplifier which has a linear response throughout the frequency range of 1.8 to 18Mhz and essentially eliminates all intermodulation distortion products, cross modulation distortion products and de-sensitization or blocking effects.

It is a further object of the invention to provide an improved RF amplifier of the nature indicated which eliminates the use of large cumbersome multi-wafered band switches, is efficient in operation and is relatively inexpensive to produce.

BRIEF DESCRIPTION OF THE DRAWINGS

For a more complete understanding of the invention reference should now be had to the accompanying drawings in which.

DESCRIPTION OF THE PREFERRED EMBODIMENT

Figure 1:
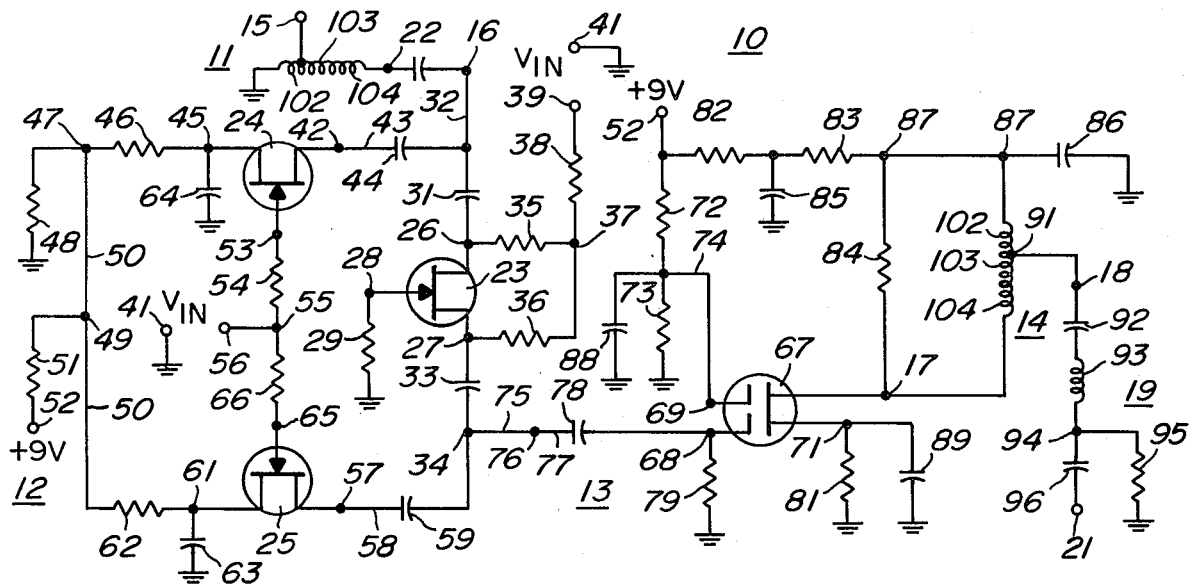
FIG. 1 is a circuit diagram of an amplifier according to the invention.

Referring to the drawings there is shown in FIG. 1 an amplifier 10 comprising an input transformer 11, an attenuator 12, an amplifier 13 and an output transformer 14.

Figure 2:
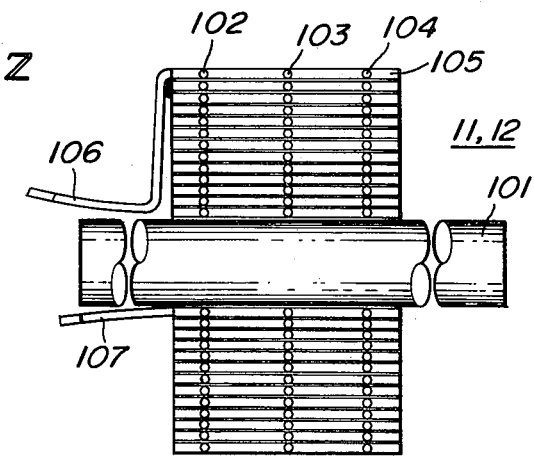
FIG. 2 is a diagrammatic sectional view of a transformer forming one component of the invention.

The transformers 11 and 14 are shown essentially in sectional view in FIG. 2 and are more completely described and claimed in the copending application of the same inventors, Ser. No. 576,828, filed May 12, 1975, entitled: High Frequency Wide Band Transformer and assigned to the same assignee as the present invention. The transformers 11 and 14 are essentially identical to each other, the input transformer 11 being connected as a step up transformer between the signal input terminal 15 and the input terminal 16 of the attenuator 12. The output transformer 14 is connected as a step down transformer from the output terminal 17 of the amplifier 13 and the input terminal 18 of a coupling network 19 which has a terminal 21 to which other components of a radio receiver, not shown, may be connected.

The transformer 11, more particularly described in the application Ser. No. 576,828, has, in the particular instance, a turns ratio of three between the terminal 15 and ground and the terminal 22 and ground so that the impedance ratio between the input and the output is three squared or nine. The impedance as seen by terminal 15 which may be 50ohms in the typical case of a receiver connected to the usual filters and an antenna reflects as an impedance at terminal 22 and at the input terminal 16 of the attenuator 12 of 450ohms. Thus the attenuator functions at the high impedance level which enables it to develop its attenuation over the frequency band of 1.6–18Mhz linearly as will be described.

The attenuator 12 comprises a $\pi$ network including the series J-Fet 23 and the parallel J-Fets 24 and 25. The J-Fets 23, 24 and 25 may be, for example, those designated by the semiconductor industry as 2N4416, depletion made devices, but are biased to function in both the enhancement and depletion modes.

The series J-Fet 23 has its source connected to a terminal 26, its drain connected to a terminal 27, its gate connected to a terminal 28 and thus through a resistor 29 (10k ohms) to ground as shown. The terminal 26 is connected through a capacitor 32 (0.01 $\mu$F) and through a conductor 32 to input terminal 16. The drain terminal 27 is connected through a capacitor 33 (0.01 $\mu$F) to output terminal 34. The terminals 26 and 27 are connected respectively through resistors 35 and 36, each of about 820ohms, to a common terminal 37 and thus through a resistor 38 (10k ohms) to input terminal 39, the other input terminal 41 being connected to ground.

The input J-Fet 24 has a drain terminal 42 connected through conductor 43 and capacitor 44 (0.01 $\mu$F) to conductor 32. The source terminal 45 of J-Fet 24 is connected through a resistor 46 (1k ohms) to terminal 47 and thus through resistor 48 (22k ohms) to ground. The terminal 47 is connected through a conductor 50 to terminal 49 and thus through a resistor 51 (15k ohms) to terminal 52 which may be connected to a power source, for example, +9 volts. The gate of J-Fet 24 is connected to terminal 53 and through a resistor 54 (10k ohms) to terminal 55 and thus to input terminal 56, the other input terminal 41 being connected to ground as shown.

While input terminals 56 and 39 are shown separately these terminals would be connected to the same source of input voltage which would be the usual source of automatic gain control voltage. In a single side band receiver such an automatic gain control voltage would be taken from the IF or audio stages, as is well known.

The J-Fet 25 has its drain terminal 57 connected through conductor 58 to capacitor 59 (0.01 $\mu$F) and thus to terminal 34. The source of J-Fet 25 is connected to terminal 61 and resistor 62 (1k ohms) to conductor 50 and terminal 49 for bias purposes. To complete the path for the AC signal, the terminal 61 of J-Fet 25 is connected through capacitor 63 (0.01 $\mu$F) to ground and the source terminal 45 of J-Fet 24 is connected through capacitor 64 (0.01 $\mu$F) to ground. The gate of J-Fet is connected to a terminal 65 and through a resistor 66 (10K ohms) to terminals 55 and 56.

In operation of the attenuator with zero volts applied at terminals 39 and 56, J-Fet 23 exhibits a low channel resistance ($R_{ds}$ typically 100–200 ohms) because $V_{gs}$ equals zero. J-Fets 24 and 25 exhibit high channel resistances (typically about 8,000 ohms) because they are biased close to or into the pinch off region of the devices with $V_{gs}$ set to 5.5. volts by resistors 48 and 51. Operation of the attenuator with input voltage at terminals 56 and 39 of 6 volts allows J-Fet 23 to operate into the pinch off region but resistors 35 and 36 carefully control the resistance between terminals 26 and 27 at very high RF input levels to prevent instability. Under the condition of 6 volts input the J-Fets 24 and 25 have a bias of $V_{gs}$ equal to 0.5 volts and show minimum channel resistance, typicallly about 100 ohms.

Capacitors 63 and 64 and resistors 46 and 62 also function to de-couple J-fet 24 from J-Fet 25. Resistors 38, 29, 54 and 66 are provided to isolate the attenuator from any outside circuit perturbations which might be transferred on to the desired signal and appear as instabilities in the recovered wave form.

The wide band RF attenuator, as described, would normally be used in conjunction with the receiver gain control circuitry, but can in addition, be controlled manually if desired. It is used in the described circuit, for example, over the amplifier operating range of 1.8–18Mhz. The attenuator under normal conditions exhibits less than 1db of insertion loss. Operation over a DC voltage range of 0–6 volts provides 45db of attenuation when the circuit is operated into a high impedance souce such as the gate of RF amplifier 67 to be described. The output impedance of the filter presented to the attenuator input should be 450 ohms or greater for 45db of attenuation.

Figure 3:
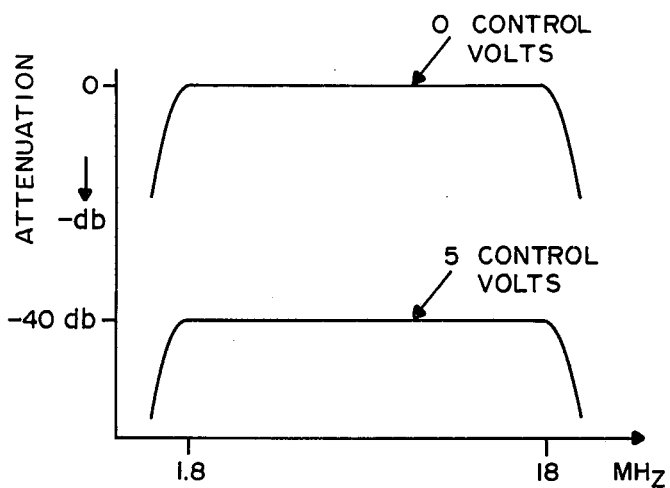
FIGS. 3 and 4 are graphs illustrating the response of another component of the invention.
Figure 4:
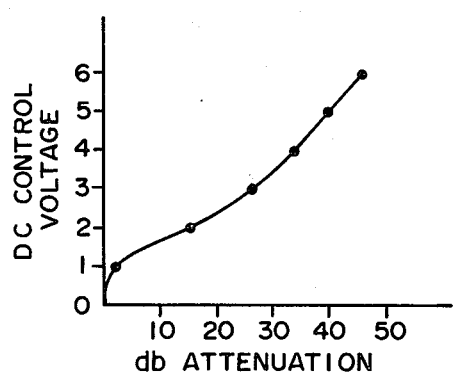

Referring to FIG. 3 and 4, there is shown a series of graphs of RF Attenuator Response. In FIG. 3 only two curves are shown, one for 0 control volts and one for 5 control volts. It will be understood that the family of curves for control volts between 0 and 5 will have the same shape as these shown and may be drawn by considering the values shown in FIG. 4. As is evident in FIG. 3 the response is linear between 1.8 and 18Mhz.

The RF amplifier 13 comprises a field effect transistor, specifically a MosFet which, for example, may be one designated by the industry as 3N204. MosFet 67 is a dual gate device, operating in the depletion mode, and has a signal gate, or gate one, connected to terminal 68 and a bias gate, or gate two, connected to a terminal 69. The drain is connected to output terminal 17 and the source is connected to a terminal 71.

Power is supplied to amplifier 13 and MosFet 67 from terminal 52 which, for example, may be at 9+ volts. Resistors 72 (8.2k ohms) and 73 (6.8k ohms) maintain, through conductor 74, a 4 volt DC potential on bias gate two (terminal 69) for best operating point and gain of the MosFet 67. The input signal at terminal 34 of the attenuator 12 is supplied over conductor 75 to terminal 76, through conductor 77 to capacitor 78 (0.01 $\mu$F) and to input terminal 68 which is connected to signal input gate one. Resistor 79 (47k ohms) is connected to terminal 68 and provides a gate return or bleed off function. Resistor 81 (100 ohms) limits the drain current of MosFet 67 to less than $I_{dss}$ for better control of stage gain and to satisfy the device dissipation parameters over temperature.

Resistor 82 (100 ohms) and resistor 83 (100 ohms) are connected to the drain of MosFet 67 and terminal 17 through resistor 84 (15k ohms). In addition, capacitor 85 (0.01 $\mu$F) is connected to the junction of resistors 82 and 83 and a capacitor 86 (0.05 $\mu$F) is connected to terminal 87 at the other end of resistor 83. Resistors 82 and 83 and capacitors 85 and 86 form a de-coupling network to prevent instability during certain conditions of operation of the amplifier. Capacitor 88 (0.01 $\mu$F) is a de-coupling capacitor adding to the stability of operation. Capacitor 89 (0.01 $\mu$F) is an RF bypas capacitor providing full range of dynamic swing for the AC signal applied to the MosFet.

The impedance of the amplifier 13 is in the vicinity of 450 ohms and appears as the input impedance to transformer 14 which as previously indicated has a turns ratio of 3 to 1, the input to the transformer appearing across terminals 17 and 87. Transformer 14 is a step down transformer and thus its output voltage appears between terminals 91 and 87. Terminal 91 is connected to terminal 18 and thus to capacitor 92 (0.002 $\mu$F), capacitor 92 being connected to inductor 93 (0.41 $\mu$F). The output of the inductor 93 is connected to terminal 94 at which terminal a resistor 95 (120 ohms) and capacitor 96 (0.01 $\mu$F) are connected. The output of capacitor 96 is connected to terminal 21 which is the output terminal of the amplifier and normally would be connected to the input of the first mixer stage (not shown). The high impedance of the MosFet 67 appearing as 450 ohms input to the transformer 14 is reflected as a 50 ohm impedance between terminals 91 and 87 which is the impedance as would be seen by the first mixer stage.

The inductor 93 together with resistor 95 cancels the capacitive reactance of transformer 14 above 12Mhz and maintains the proper output impedance as presented to the first mixer (not shown) connected to terminal 21. Together with the coupling capacitor 96, inductor 93 and resistor 95 serve as an impedance matching network, 50 ohms resistive, for the following circuits.

For the overall response of the attenuator and amplifier to be flat over the frequency range of 1.8 to 18 Mhz, ie., no roll off at the high end, the channel resistance of J-Fet 23 and the attenuator must be relatively low, for example, in the vicinity of 100 ohms. Also the series resistance in the conductor leading to the signal gate one of MosFet 67 must be low because the resistance and capacity effects of gate one must be made as small as possible.

While in FIG. 3 it is shown that the response of the attenuator is flat over the range of 1.6 to 18 Mhz the overall response of the amplifier from input terminal 15 to output terminal 18 is maintained flat from about 1.8 to 18Mhz.

In the overall operation of the amplifier an RF signal is presented to terminal 15 of transformer 11 which steps up the impedance to 450 ohms. The new level of impedance passes through an RF attenuator 12 with normal insertion loss less than 1db and to the gate one of the RF amplifier MosFet 67. A similar impedance transformation happens in reverse to transformer 14. Thereby, the RF amplifier circuit has a 50 ohm input and output impedance and the field effect amplifier has a voltage gain of 20 dB.

In the operation of the device, it may be envisioned that a small desired signal and a quite large undesired signal will exist at the input of the amplifier at the same time. The undesired large signal may result in the development of intermodulation and cross modulation products. But the automatic gain control circuitry provides a control voltage connected to terminals 39 and 56 thereby attenuating the large undesired signal by an appropriate amount. The same attenuation, of course, also applies to the desired small signal. However, because of the attenuation of the large undesired signal, intermodulation, and cross modulation products are eliminated and, consequently the small desired signal is not obscured. It can, subsequently, be selected by the tuning networks and amplified without having in it any presence of cross modulation products or intermodulation products.

Referring to FIG. 2 there is shown, in essence, a cross sectional view of the transformers 11, 14, as used at the input of the attenuator 12 and at the output of the amplifier 13. Previous reference has been made to the copending application Ser. No. 576,828. As shown in FIG. 2 the transformer comprises a core 101 which may be of ferrite material and is stub ended cylinder for example. The windings of the transformer comprise three conductors 102, 103 and 104 which are embedded in layers of synthetic insulating material, for example, polyolefin and polyester 105. By virtue of the conductors being held in parallel spaced relationship by the supporting insulating material the layers are wound spirally on each other. Hence the turns of conductor 102 are wound spirally on each other, the turns of conductor 103 are wound spirally on each other and the turns of conductor 104 are would spirally on each other. Thus the three windings 102, 103 and 104 are in effect flat spiral windings spaced from each other. The outer end of winding 102 is connected to the inner end of winding 103 and the outer end of winding 103 is connected to the inner end of winding 104. The outer end of winding 104 thus becomes the output conductor 106 and the input to the transformer becomes conductor 107. The total number of turns in each winding, in the particular case, was 13 ½ giving a total number of turns of 40 ½. As shown in FIG. 1 the transformers 11 and 14 are connected in autotransformer relationship.

While specific values of parameters have been given in a particular case, it will be understood that this is exemplary, and that other values may be used within the skill of the art.

We claim:
1. A RF amplifier circuit having input and output connections comprising:
   a first wide band step-up trnasformer having input and output connections and a relatively high impedance transformation ratio, the input connection of said first transformer being coupled to the input connection of said RF amplifier circuit;
   a wideband field effect attenuator, having at least one series element, at least one shunt element, an input connection and an output connection, the input connection of which is coupled to the output connection of said first transformer;
   a field effect amplifier, having a source, a drain and gate means, the gate means being coupled to the attenuator output connection;
   a second wide band step-down transformer, having input and output connections and a relatively high impedance transformation ratio, the input connection of said second transformer being connected to the drain of said field effect amplifier, and the output connection of said second transformer being coupled to the output connection of said RF amplifier circuit.

2. The RF amplifier according to claim 1 wherein said field effect attenuator comprises a network of one series and two parallel field effect transistors.

3. The RF amplifier according to claim 1 wherein said first and second wide band transformers comprise relatively high turns ratio transformers.

4. The RF amplifier according to claim 3 wherein each of said transformers comprises a series of flat windings each of which is spirally wound on itself.

5. The RF amplifier according to claim 4 wherein said series of flat windings comprises a winding strip in which the wires are laid parallel to each other and are embedded in synthetic insulating material.

6. The RF amplifier according to claim 1 wherein said field effect transistor amplifier comprises a dual gate MosFet amplifier, one gate of which comprises a bias gate and the other of which comprises a signal input gate.

7. The RF amplifier according to claim 4 wherein the turns ratio of said transformers comprises about 3.

8. The RF amplifier according to claim 1 wherein said series and said parallel transistors comprise junction field effect transistors.

* * * * *